United States Patent
Tinnemeyer et al.

(10) Patent No.: US 7,622,929 B2
(45) Date of Patent: Nov. 24, 2009

(54) PULSE-DISCHARGE BATTERY TESTING METHODS AND APPARATUS

(75) Inventors: Joern Tinnemeyer, Richmond (CA); Zoe Carlin, Vancouver (CA)

(73) Assignee: CADEX Electronics Inc., Richmond (CA)

(*) Notice: Subject to any disclaimer, the term of this patent is extended or adjusted under 35 U.S.C. 154(b) by 281 days.

(21) Appl. No.: 11/459,912

(22) Filed: Jul. 25, 2006

(65) Prior Publication Data

US 2008/0024137 A1    Jan. 31, 2008

(51) Int. Cl.
*G01N 27/416* (2006.01)
*H02J 7/00* (2006.01)
*H02J 7/06* (2006.01)
*H02J 7/24* (2006.01)
*H01M 10/48* (2006.01)
*G08B 21/00* (2006.01)

(52) U.S. Cl. .................. 324/426; 320/129; 320/159; 340/636.1; 340/636.21; 429/90

(58) Field of Classification Search .............. 324/426; 320/129, 159
See application file for complete search history.

(56) References Cited

U.S. PATENT DOCUMENTS

| | | | |
|---|---|---|---|
| 4,745,349 A | 5/1988 | Palanisamy et al. | |
| 5,281,919 A | 1/1994 | Palanisamy et al. | |
| 5,642,100 A | 6/1997 | Farmer | |
| 6,137,292 A | 10/2000 | Hirsch et al. | |
| 6,215,312 B1 | 4/2001 | Hoenig et al. | |
| 6,411,911 B1* | 6/2002 | Hirsch et al. ............ | 702/63 |
| 6,618,681 B2 | 9/2003 | Hoenig et al. | |
| 2003/0206021 A1* | 11/2003 | Laletin et al. ............ | 324/426 |
| 2004/0157113 A1* | 8/2004 | Klang ...................... | 429/50 |

* cited by examiner

*Primary Examiner*—Edward Tso
*Assistant Examiner*—Yalkew Fantu
(74) *Attorney, Agent, or Firm*—Oyen Wiggs Green & Mutala LLP (57) ABSTRACT

A method for evaluating the conditions a battery comprises applying a discharge pulse to the battery and monitoring a response of the battery to the discharge pulse. In some embodiments a measure of battery condition is based at least in part on at least one of first and second parameters. The first parameter is related to the decrease in battery voltage after the onset of the discharge pulse. The second parameter is related to the recovery of the battery voltage after the discharge pulse. The first and/or second parameters may be supplied as inputs to an evaluation system such as a neural network, a fuzzy logic inference engine or the like.

24 Claims, 4 Drawing Sheets

PULSE-DISCHARGE BATTERY TESTING METHODS AND APPARATUS

TECHNICAL FIELD

This invention relates to methods and apparatus for evaluating the condition of electrochemical batteries. The methods and apparatus may be applied to testing batteries having various chemistries. For example, the methods and apparatus may be applied to testing lithium batteries or lead-acid batteries.

BACKGROUND

Electrochemical batteries have a very wide range of applications. Such batteries have limited life spans. Over time and with use the condition of a battery is degraded. Eventually the battery is unable to meet requirements. For example, the battery may become unable to hold a charge adequately or at all or it may become unable to supply a desired current. The condition of any particular battery (sometimes called the "state of health" or "SoH") is a function of the design of the battery, variables relating to the manufacture of the battery, the history of the temperature and other environmental conditions in which the battery has been stored, the number of charge-discharge cycles that the battery has experienced, and the nature of the charge-discharge cycles that the battery has experienced. Because the condition of a battery depends upon so many factors, it is not generally possible to predict reliably when a particular battery will cease to meet applicable specifications.

Where batteries power critical equipment, one can replace the batteries periodically whether or not they appear to need replacing. However, in a group of seemingly identical batteries there can be a broad spread in the time taken for the batteries to fail. This strategy is expensive because it mandates replacing most batteries when a significant portion of their useful life remains.

Another strategy is to monitor the condition of batteries by testing the batteries. Appropriate tests may be able to detect that the condition of a particular battery is becoming worse so that the battery can be replaced before it fails. Some such tests are undesirably time consuming and may require that the battery be in a particular state of charge for the tests to be conducted.

Existing methods for rapid testing of batteries do not work well for batteries of all chemistries. For example, using current tests it can be difficult to obtain rapid accurate measurements of the condition of lithium batteries, especially lithium batteries having cathodes that incorporate manganese.

There is a need for methods and apparatus that can be used to evaluate the condition of electrochemical batteries. There is a particular need for such methods and apparatus that can test batteries rapidly.

The foregoing examples of the related art and limitations related thereto are intended to be illustrative and not exclusive. Other limitations of the related art will become apparent to those of skill in the art upon a reading of the specification and a study of the drawings.

SUMMARY

The invention is described and illustrated in conjunction with the appended drawings, which are meant to be exemplary and illustrative, not limiting in scope.

One aspect of the invention provides a method for evaluating the condition of a battery. The method comprises: applying a discharge pulse to the battery; measuring a response of the voltage of the battery to the discharge pulse; obtaining at least one parameter relating to a change in the battery voltage resulting from the application of the discharge pulse; and, computing a measure of a condition of the battery based at least in part on the at least one parameter. The discharge pulse has a duration in the range of 1 to 6 seconds in some embodiments.

Another aspect of the invention provides a method for evaluating the condition of a battery. The method comprises: applying a discharge pulse to the battery; taking first measurements of the voltage of the battery at selected times during the discharge pulse; from the first measurements obtaining a first parameter relating to a reduction of the battery voltage after an onset of the discharge pulse; and, computing a measure of a condition of the battery based at least in part on the first parameter.

A further aspect of the invention provides apparatus for testing batteries. The apparatus comprises: first and second connectors for connecting to terminals of a battery under test; a volt meter connected to measure a voltage between the first and second connectors; a current sink switchably connectable between the first and second connectors; a controller configured to cause the current sink to be connected between the first and second connectors for an interval to cause a discharge pulse to be applied to the battery under test and to sample an output from the volt meter at least at a plurality of times during the interval. The controller may provide automated testing of batteries in a relatively short period. In some embodiments, the apparatus comprises a battery charger and is configured to charge the battery during a charging period, allow the battery to rest for a rest period and then test the battery as described herein.

Further aspects and features of embodiments of the invention are described herein and illustrated in the accompanying drawings.

BRIEF DESCRIPTION OF DRAWINGS

The appended drawings illustrate non-limiting example embodiments of the invention.

DESCRIPTION

Throughout the following description specific details are set forth in order to provide a more thorough understanding to persons skilled in the art. However, well known elements may not have been shown or described in detail to avoid unnecessarily obscuring the disclosure. Accordingly, the description and drawings are to be regarded in an illustrative, rather than a restrictive, sense.

This invention obtains measures of the condition of batteries by applying discharge pulses to the batteries and monitoring certain features of the responses of the batteries to the discharge pulses.

Figure 1:
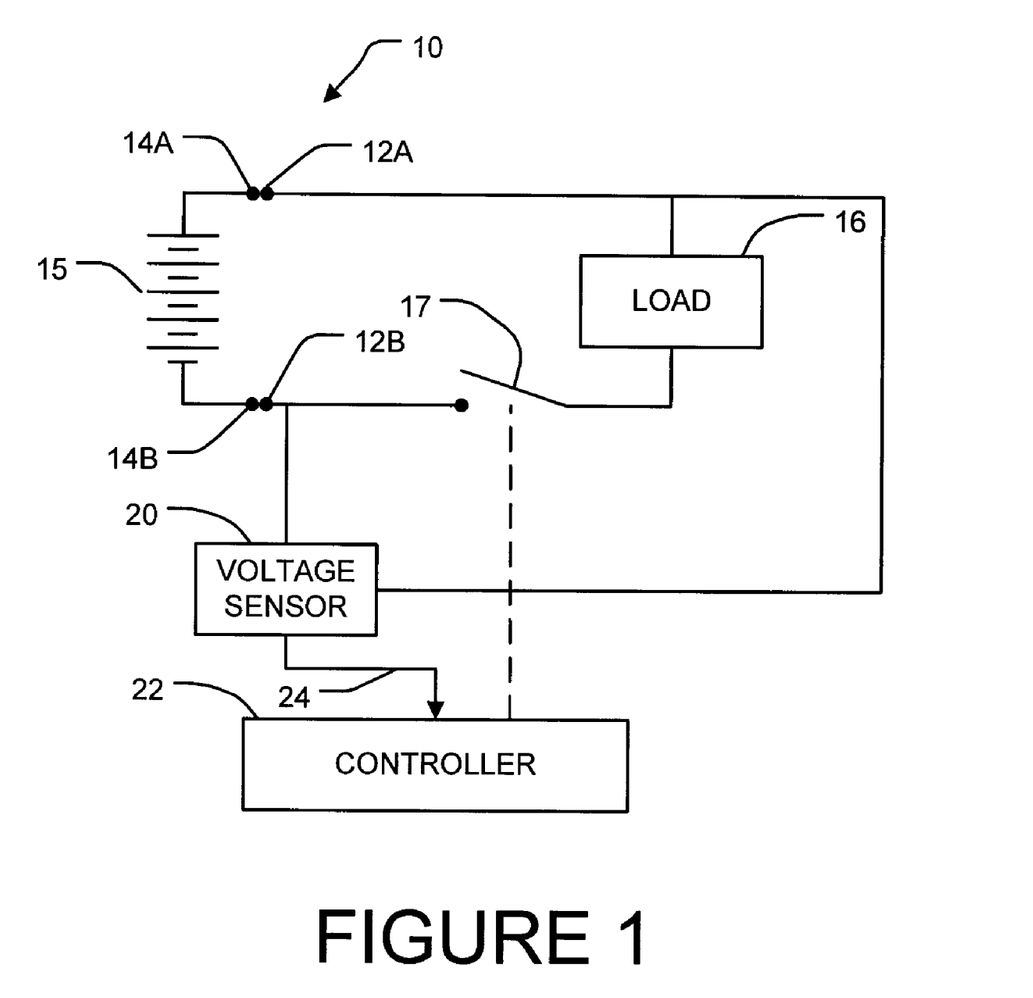
FIG. 1 is a block diagram illustrating apparatus according to an embodiment of the invention.

FIG. 1 is a block diagram illustrating apparatus 10 according to the invention. Apparatus 10 has connectors 12A and 12B that connect to corresponding terminals 14A and 14B of a battery 15 being tested. Apparatus 10 comprises a load 16 that can be selectively connected between terminals 12A and 12B by a switch 17. A voltage sensor 20 monitors a potential difference between terminals 12A and 12B. A controller 22 controls switch 17 to cause a discharge pulse to be applied to battery 15 by connecting load 16 between terminals 12A and 12B during an interval T1 (see FIG. 2).

A signal 24 representing the potential difference sensed by voltage sensor 20 is provided to controller 22. Controller 22 monitors signal 24 and derives parameters from signal 24 that are indicative of the condition of battery 15. Controller 22 derives a measure of a condition of battery 15 based upon the parameters.

Load 16 may comprise a resistor or may comprise a transistor or other active device that can be controlled to permit a current to flow through it. Where load 16 comprises an active device then load 16 may also serve as switch 17.

Figure 2:
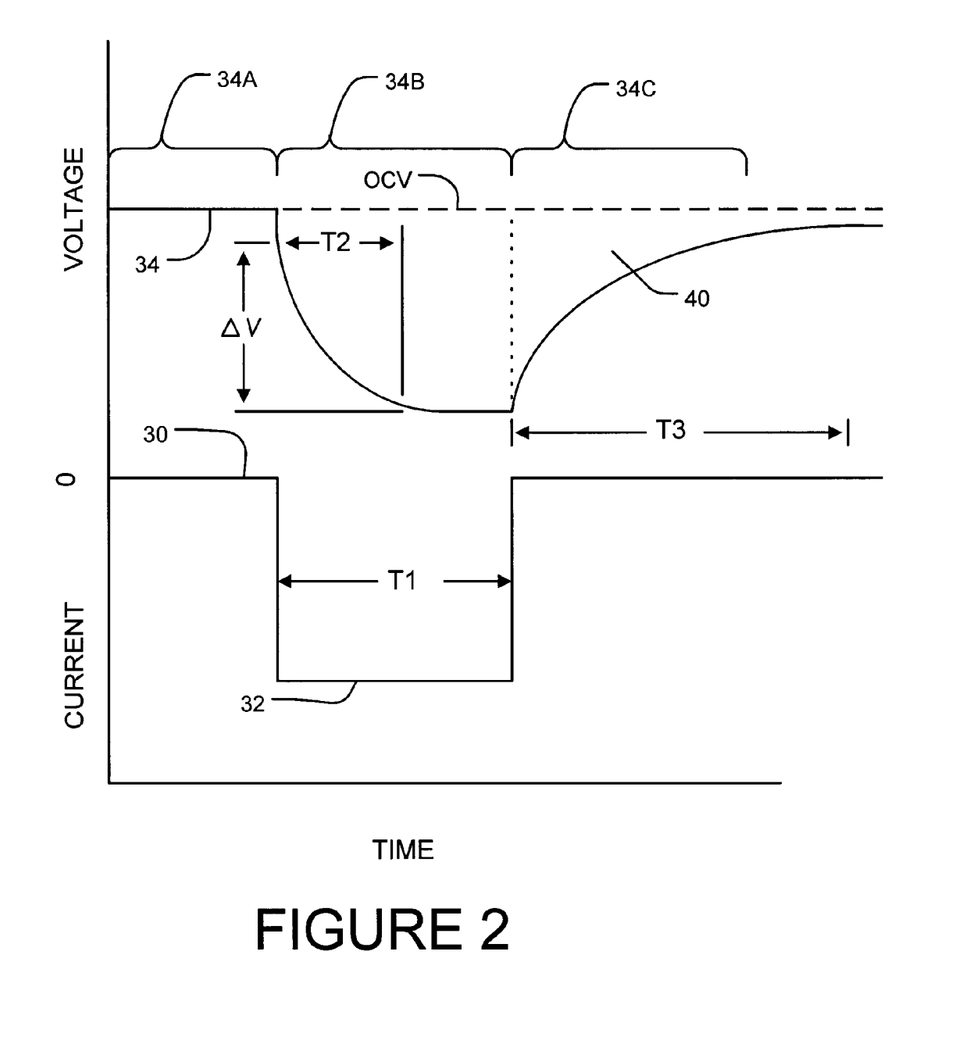
FIG. 2 is a plot showing voltage and current as a function of time during a test of a battery.

FIG. 2 shows a current waveform 30 that includes a discharge pulse 32 having a duration T1 as well as a voltage waveform 34 that represents a response of battery 15 to current pulse 32. Voltage waveform 34 has three parts, a first part 34A prior to the leading edge of discharge pulse 32, a second part 34B during discharge pulse 32 and a third part 34C after the trailing edge of discharge pulse 32. During second part 34B the battery voltage falls almost immediately as a result of the voltage dropped across the internal resistance of the battery under test. The voltage then continues to drop as a result of the effect of current pulse 32 on the battery under test.

The battery under test is preferably rested (i.e. neither charged significantly nor discharged significantly) for a period of at least a few minutes prior to the test. For best results, the battery under test should have a state-of-charge of at least 40% or so (i. e. the test results may be unreliable if the battery is discharged or almost discharged when the test is performed).

In various different embodiments:
T1 is in the range of 1 to 6 seconds, in some cases in the range of 2 to 5 seconds;
T1 exceeds 2 seconds; or,
T1 does not exceed 6 seconds.

The exact value of T1 is not critical. It is desirable to have T1 fairly short so that testing can be completed faster but long enough to obtain values for the parameters to be used in evaluating the condition of the battery under test.

Controller 22 may comprise a data processor that executes software instructions which cause the data processor to control switch 17 to cause a discharge pulse and to monitor signal 24 during appropriate periods so as to acquire the data necessary to derive the parameters. Controller 22 could also comprise hard-wired apparatus that performs the required functions.

It should be noted that the apparatus shown in FIG. 1 is an example only. It is not mandatory that the same controller that controls the application of a discharge pulse to battery 15 also: monitor signal 24, derive parameters from signal 24 and/or derive a measure of condition of battery 15. These functions could be distributed among a number of separate circuits and/or data processors. The term controller, as used herein, encompasses a system that has multiple components that cooperate to provide control functions.

The magnitude of current pulse 32 is sufficient that the voltage of the battery exhibits a dynamic response to the current pulse that is measurable with sufficient precision to distinguish batteries based upon their conditions. The magnitude of the discharge pulse is not so great as to risk any damage to the battery or to trigger protective circuitry associated with the battery. Therefore, the magnitude of discharge pulse 32 may be set based at least in part upon the type of battery being tested. In some embodiments, particularly for batteries having rated capacities of a few Ampere-hours or less, the magnitude of discharge pulse 32 in Amperes is in the range of 0.1 to 2 times a rated capacity of the battery-under test measured in Ampere hours.

Methods according to the invention base an assessment of battery condition, at least in part, on at least one of a first parameter that is derived from the response of the battery during second part 34B of voltage waveform 34 and a second parameter that is derived from the response of the battery during third part 34C of voltage waveform 34. In preferred embodiments, the assessment of battery condition is based upon both of the first and second parameters and is optionally based additionally on other parameters.

In an example embodiment, the first parameter is a measure of the reduction in battery voltage 34 resulting from the application of discharge pulse 32. As soon as discharge pulse 32 commences some voltage will be dropped as a result of the internal resistance of the battery under test. If battery voltage could be monitored continuously with a perfect voltmeter, the voltage drop resulting from the internal resistance of the battery would manifest itself as a very rapid (essentially instantaneous) drop in measured voltage. The first parameter is preferably relatively insensitive to the voltage dropped by the internal resistance. One way to achieve this is to base the first parameter on voltage measurements taken after the battery voltage has dropped as a result of the internal resistance of the battery under test. For example, the first parameter may be based upon a decrease in voltage during a period beginning a short time (e.g. a time less than about 1 second and most typically less than ½ second) after the leading edge of discharge pulse 32.

In some embodiments, the first measure is the value of $\Delta V$ as shown in FIG. 2. $\Delta V$ is the difference between the battery voltage just after the onset of discharge pulse 32 and the equilibrium value that the battery voltage tends toward as the discharge pulse continues. $\Delta V$ can be measured by taking a first reading of voltage 34 a short time (e.g. a fraction of a second) after the leading edge of discharge pulse 32, taking a second reading of voltage 34 after a time interval T2 sufficient for voltage 34 to have fallen by a measurable amount in response to the current drain during the current pulse. The first and second readings may then be subtracted. As described below, there are a number of ways to obtain a first parameter that is functionally equivalent to the difference between the first and second voltage readings.

In an example embodiment, the second parameter is a measure of the rate at which the battery voltage recovers toward its open circuit voltage ("OCV") after the trailing edge of discharge pulse 32. In some embodiments, the second parameter is a measure of the area 40 between voltage waveform 34 and the OCV during third part 34C of voltage waveform 34. The OCV may be determined by monitoring battery voltage during first part 34A of voltage waveform 34. Area 40 may be measured by integrating the difference between the measured voltage and the OCV over a time T3 sufficient for the battery voltage to recover substantially toward the OCV. Where multiple batteries of the same type are being tested it is preferable to integrate over the same time for all of the batteries to ensure that the test results are directly comparable.

Figure 3:
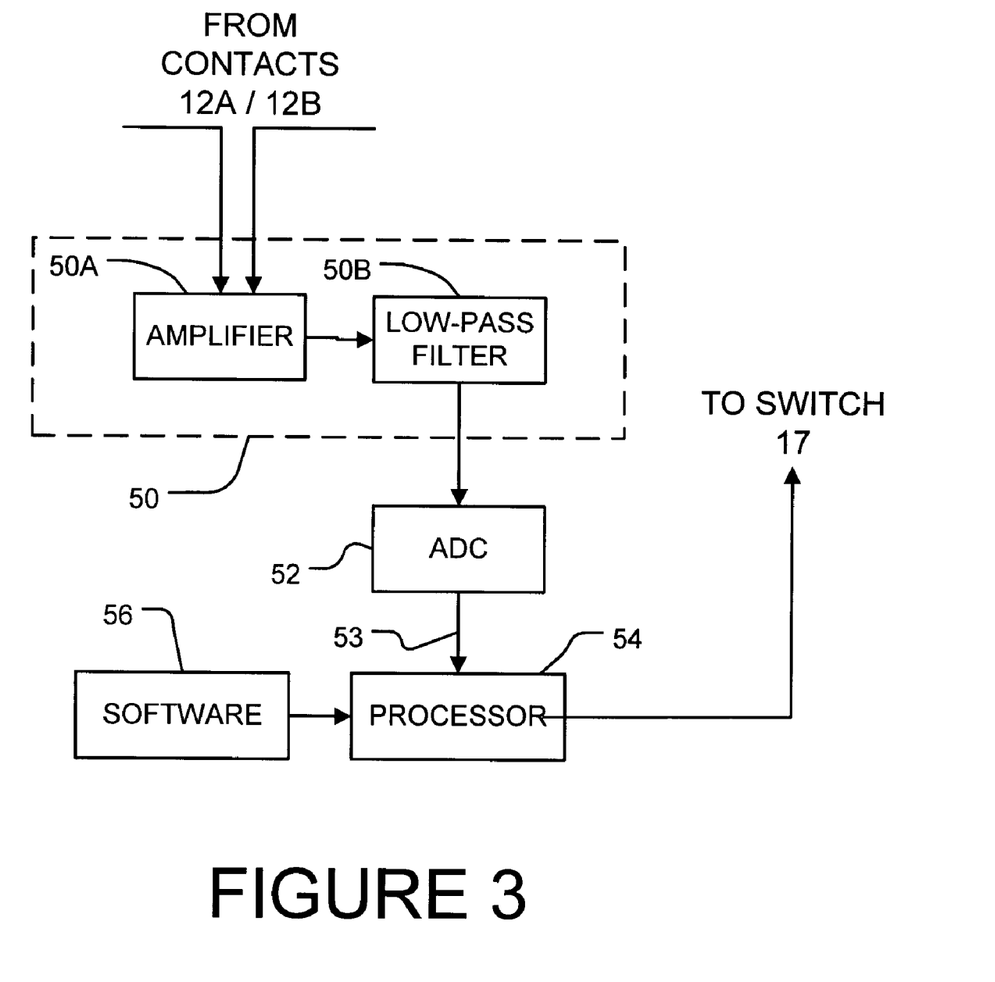
FIG. 3 is a block diagram illustrating apparatus according to a more detailed embodiment of the invention.

In a particular embodiment, apparatus 10 samples the voltage of the battery under test periodically. The sampling rate is preferably high enough that there are a significant number of samples taken at least during part 34C of voltage waveform 34. In one embodiment, as shown in FIG. 3, voltage sensor 20 comprises a signal conditioning circuit 50 which may comprise, for example, one or more of an amplifier 50A and a low-pass filter 50B. An analog-to-digital converter 52 digitizes the signal at the output of signal conditioning circuit 50 at a suitable rate and passes the samples 53 to a processor 54 that executes software 56. Within reason, more accurate parameter values may be achieved by selecting a higher sample rate. In some example embodiments of the invention voltage waveform 34 is sampled at a rate in the range of about 5 Hz to a few hundred Hz. Higher sampling rates could be used but are typically not necessary or beneficial since the response of most batteries to a discharge pulse 32 is typically characterized by a time constant that is greater than about 0.1 seconds.

Processor 54 controls switch 17 to create discharge pulse 32 and also computes the first and second parameters from samples 53. OCV may be measured from one sample taken before switch 17 is closed. Preferably, however, OCV is determined from two or more samples 53 taken during first part 34A. For example, the two or more samples may be averaged to obtain an estimate of the OCV. The first parameter, $\Delta V$ may be determined by computing a difference between a first sample taken a short time after the start of second part 34B of voltage waveform 34 and a second sample taken a time T2 later. Processor 54 may compute area 40 by subtracting the sum of the N samples taken during a period T3 from N times the OCV.

Processor 54 may be programmed to compute various functional or mathematical equivalents of these parameters in the alternative. For example:

The first parameter could be an area between voltage curve 34 and an arbitrary value above or below voltage curve 34;

The first parameter could comprise a voltage difference over some shorter interval within period T2. For example the first parameter could measure the change in voltage over the first X seconds of a Y second long discharge pulse where X<Y;

The first parameter could be based upon a voltage change over a period that includes the leading edge of discharge pulse 32 and the internal resistance of the battery under test. The voltage drop due to the battery's internal resistance could then be subtracted or otherwise cancelled during computation of the first parameter;

The second parameter could comprise a parameter of a curve, such as an exponential or polynomial curve fit to samples taken during third part 34C.

The second parameter could be, or be derived from, a derivative of voltage curve 34 taken at a specified point during the period T3.

Processor 54 may be programmed to compute one or more additional parameters such as:

An amount of time taken for voltage 34 to plateau after the trailing edge of current pulse 32. The poorer the battery, the longer this time will be.

A total difference in battery voltage from a time immediately before the trailing edge of discharge pulse 32 to a plateau voltage reached during part 34C.

The instantaneous voltage of the battery immediately after the leading edge of discharge pulse 32.

One or both of the first and second parameters and, optionally, one or more of the additional parameters described above (and/or other parameters), may be supplied as inputs to an evaluation mechanism such as a fuzzy inference engine, a rules-based inference engine, a neural network or the like that has been programmed or trained to produce an output indicative of a condition of the battery based upon the parameters input to the evaluation mechanism. The fuzzy logic methods described in Tinnemeyer, U.S. Pat. No. 7,072,871 are but one example of a possible evaluation mechanism. In some embodiments, the evaluation mechanism comprises software executed by processor 54.

In some embodiments the evaluation mechanism may be set up to test batteries of a particular type with reference to a set of representative batteries. The representative batteries are selected to have a range of values for the characteristic being measured (which may be "state of health", capacity, or some other measure of battery fitness). The value of the characteristic for each representative battery may be ascertained by any suitable in-depth test(s). Where the evaluation mechanism comprises an inference system, such as a fuzzy logic inference engine or a neural network, the inference system may be trained in any suitable way, including through the use of training methods and systems known in the art.

In some embodiments, the evaluation mechanism comprises an empirically-derived formula (which may be a function of the first and/or second parameters, for example) that provides an output value indicative of a condition of the battery-under-test. If it is desired to provide a "Pass/Fail" result or a "Pass/Fail/Test more Thoroughly" result then the output of the function may be compared to one or more empirically-determined thresholds to obtain the desired result.

In some embodiments, the evaluation mechanism may be as simple as comparing one or both of the first and second parameters to a threshold. The result of the comparison may cause the evaluation mechanism to generate an indication that the battery under test is "good" or "poor". The threshold may be chosen to reflect a desired level of confidence that a battery is "good" or "bad". Suitable thresholds may be derived from the relationship between the parameter(s) and the characteristic being used as a measure of battery fitness for a reference set of batteries.

In some applications, it may be desirable to sort batteries so that only batteries that are definitely "bad" are rejected while all others pass. In other applications it may be desirable to sort batteries so that only batteries that are definitely "good" pass while all others are rejected. In other applications it may be desirable to provide multiple thresholds so that a collection of batteries can be sorted into batteries that the test indicates are almost certainly "good", batteries that the test indicates are almost certainly "bad" and batteries that ought to be subjected to more comprehensive tests to evaluate their conditions.

In some cases, the test described herein may be performed conditionally on the value of some other parameter. For example, for some battery types, a battery may be considered "bad" if its internal resistance has a value that exceeds a threshold. In some methods according to the invention the internal resistance of a battery-under-test is measured. If the value of the internal resistance indicates that the battery should be considered to have a condition of "poor" or "fail" or "bad" or the like then the method may terminate. In such cases it is not necessary to obtain or process the first and/or second parameters described above. In such cases the length of time taken for the testing can be reduced.

The testing methods and apparatus described herein may be used to evaluate the condition of batteries having a wide range of chemistries such as lithium batteries (including lithium batteries having cathodes that incorporate manganese) and lead acid batteries.

It can be appreciated that some of the specific embodiments described herein can be advantageous in that they can perform a test for evaluating the condition of a battery in a relatively short period.

Figure 4A:
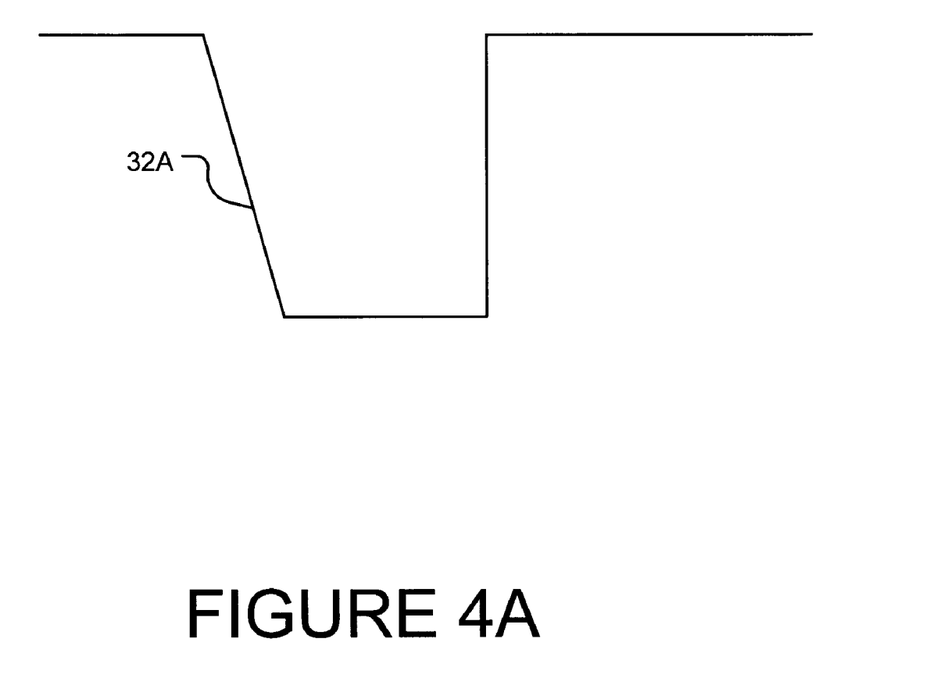
FIGS. 4A and 4B show alternative forms for a discharge pulse.

While a number of exemplary aspects and embodiments have been discussed above, those of skill in the art will recognize certain modifications, permutations, additions and sub-combinations thereof. For example:

It is not mandatory that the current draw from the battery be zero after application of the discharge pulse. The second parameter could be measured after a substantially stepwise reduction in current being drawn from the battery under test as illustrated in FIG. 4A for example which shows a modified pulse 32A.

Figure 4B:
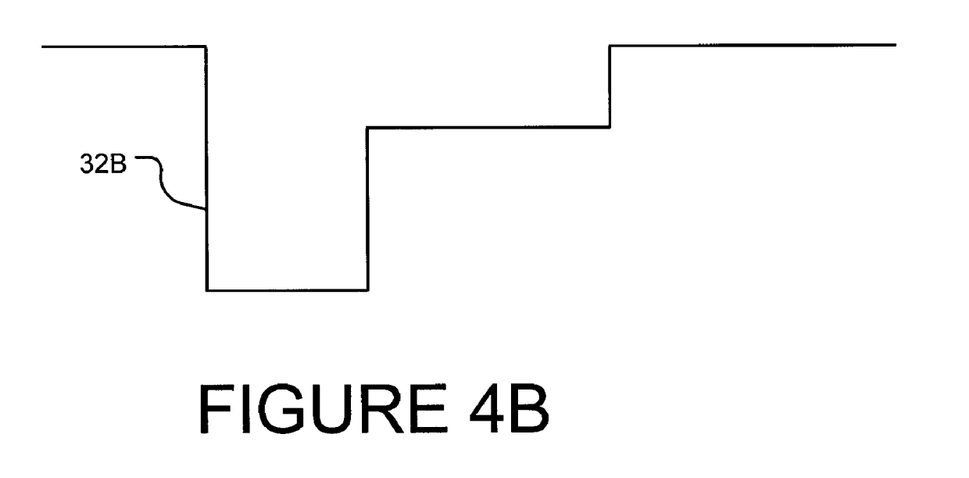

It is not mandatory that the current draw increase stepwise at the onset of pulse 32. For example, FIG. 4B shows a modified pulse 32B in which the current is ramped toward a maximum value.

It is therefore intended that the following appended claims and claims hereafter introduced are interpreted to include all such modifications, permutations, additions and sub-combinations as are within their true spirit and scope.

What is claimed is:

1. A method for evaluating the condition of a battery, the method comprising:
    applying a discharge pulse to the battery;
    measuring a response of the voltage of the battery to the discharge pulse;
    obtaining at least one parameter relating to a change in the battery voltage resulting from the application of the discharge pulse; and,
    computing a measure of a condition of the battery based at least in part on the at least one parameter
    wherein the at least one parameter comprises a difference between the battery voltage at a first time after a start of the discharge pulse and a second time during the discharge pulse and after the first time.

2. A method according to claim 1 wherein the discharge pulse has a duration in the range of 2 seconds to 5 seconds.

3. A method according to claim 2 wherein the at least one parameter comprises a parameter related to an increase in the battery voltage following an end of the discharge pulse.

4. A method according to claim 2 comprising, during the discharge pulse, making a stepwise reduction in discharge current wherein the at least one parameter comprises a parameter related to an increase in the battery voltage following the stepwise reduction in discharge current.

5. A method for evaluating the condition of a battery, the method comprising:
    applying a discharge pulse to the battery;
    taking first measurements of the voltage of the battery at selected times during the discharge pulse;
    from the first measurements obtaining a first parameter relating to a reduction of the battery voltage during a period following an onset of the discharge pulse, the first parameter comprising a difference between the battery voltage at a first time after a start of the discharge pulse and a second time during the discharge pulse and after the first time; and,
    computing a measure of a condition of the battery based at least in part on the first parameter.

6. A method according to claim 5 wherein the first time is within 2 seconds of a leading edge of the discharge pulse.

7. A method according to claim 6 wherein the second time is within one second of a trailing edge of the current pulse.

8. A method according to claim 6 wherein the second time is not more than 5 seconds after the first time.

9. A method according to claim 5 wherein the discharge pulse has a duration not exceeding 6 seconds.

10. A method according to claim 9 wherein the discharge pulse has a duration in excess of 2 seconds.

11. A method according to claim 5 wherein the discharge pulse has a magnitude in Amperes in the range of 0.1 to 2 times a rated capacity of the battery-under test measured in Ampere hours.

12. A method according to claim 5 comprising:
    taking second measurements of the voltage of the battery at selected times after the discharge pulse;
    determining a second parameter relating to an increase of the battery voltage after the discharge pulse based at least in part on the second measurements;
    wherein computing the measure of the condition of the battery is based at least in part on the second parameter.

13. A method according to claim 12 comprising:
    taking third measurements of the voltage of the battery at one or more times before the discharge pulse; and,
    from the third measurements determining an open circuit voltage of the battery;
    wherein computing the second parameter is based in part on the open circuit voltage.

14. A method according to claim 12 comprising integrating over time a difference between the open circuit voltage and the second measurements during a period subsequent to the discharge pulse wherein the second parameter is equal to or derived from a result of the integrating.

15. A method according to claim 14 comprising commencing the integrating immediately after an end of the discharge pulse.

16. A method according to claim 5 wherein computing the measure of the condition of the battery comprises supplying the first parameter as an input to an inference system.

17. A method according to claim 16 wherein the inference system comprises a fuzzy logic inference system.

18. A method according to claim 12 wherein computing the measure of the condition of the battery comprises supplying the first and second parameters as inputs to an inference system.

19. A method according to claim 18 wherein the inference system comprises a fuzzy logic inference system.

20. A method according to claim 5 comprising during the discharge pulse making a stepwise reduction in discharge current and taking second measurements of the voltage of the battery at selected times after the stepwise reduction;
    determining a second parameter relating to an increase of the battery voltage after the stepwise reduction based at least in part on the second measurements;
    wherein computing the measure of the condition of the battery is based at least in part on the second parameter.

21. Battery testing apparatus comprising:
    first and second connectors for connecting to terminals of a battery under test;
    a volt meter connected to measure a voltage between the first and second connectors;
    a current sink switchably connectable between the first and second connectors;
    a controller configured to:
    cause the current sink to be connected between the first and second connectors for an interval to cause a discharge pulse to be applied to the battery under test;
    sample an output from the volt meter at least at a plurality of times during the interval;
    obtain at least one parameter relating to a change in the battery voltage resulting from the application of the discharge pulse, the at least one parameter comprising a difference between the battery voltage at a first time after a start of the discharge pulse and a second time during the discharge pulse and after the first time; and compute a measure of a condition of the battery based at least in part on the at least one parameter.

22. Apparatus according to claim 21 wherein the controller is configured to sample the output from the volt meter at a plurality of times after an end of the discharge pulse and to integrate over a period subsequent to the discharge pulse a difference between an open circuit voltage for the battery and the sampled output from the volt meter.

23. Apparatus according to claim 22 wherein the controller is configured to measure the open circuit voltage of the battery by obtaining sampled output of the volt meter for a plurality of times prior to the discharge pulse and averaging the sampled output of the voltmeter.

24. A method according to claim 5 comprising sampling the voltage of the battery at a plurality of times after an end of the discharge pulse and integrating over a period subsequent to the discharge pulse a difference between an open circuit voltage of the battery and the sampled voltages.

* * * * *

UNITED STATES PATENT AND TRADEMARK OFFICE
CERTIFICATE OF CORRECTION

| | | |
|---|---|---|
| PATENT NO. | : 7,622,929 B2 | Page 1 of 1 |
| APPLICATION NO. | : 11/459912 | |
| DATED | : November 24, 2009 | |
| INVENTOR(S) | : Joern Tinnemeyer and Zoe Carlin | |

It is certified that error appears in the above-identified patent and that said Letters Patent is hereby corrected as shown below:

On the Title page, in the Title page figure, the reference numeral appearing as "5" is corrected to read --15--.
Column 7, line 9, "FIG. 4A" is corrected to read --FIG. 4B--.
Column 7, line 10, "32A" is corrected to read --32B--.
Column 7, line 12, "FIG. 4B" is corrected to read --FIG. 4A--.
Column 7, line 13, "32B" is corrected to read --32A--.

Signed and Sealed this
Twenty-fifth Day of January, 2011

David J. Kappos
*Director of the United States Patent and Trademark Office*